United States Patent
Zhang et al.

(10) Patent No.: US 11,777,520 B2
(45) Date of Patent: Oct. 3, 2023

(54) GENERIC COMPRESSION RATIO ADAPTER FOR END-TO-END DATA-DRIVEN COMPRESSIVE SENSING RECONSTRUCTION FRAMEWORKS

(71) Applicant: ARIZONA BOARD OF REGENTS ON BEHALF OF ARIZONA STATE UNIVERSITY, Scottsdale, AZ (US)

(72) Inventors: Zhikang Zhang, Mesa, AZ (US); Fengbo Ren, Tempe, AZ (US); Kai Xu, Tempe, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 401 days.

(21) Appl. No.: 17/218,738

(22) Filed: Mar. 31, 2021

(65) Prior Publication Data

US 2021/0305999 A1    Sep. 30, 2021

Related U.S. Application Data

(60) Provisional application No. 63/002,770, filed on Mar. 31, 2020.

(51) Int. Cl.
*H03M 7/34* (2006.01)
*H03M 7/30* (2006.01)
(Continued)

(52) U.S. Cl.
CPC .......... *H03M 7/6047* (2013.01); *G06N 3/045* (2023.01); *G06N 3/08* (2013.01); *G06N 3/084* (2013.01); *G06N 20/20* (2019.01)

(58) Field of Classification Search
CPC ... H03M 7/6047; G06N 3/045; G06N 3/0454; G06N 3/08; G06N 3/084; G06N 20/20
See application file for complete search history.

(56) References Cited

U.S. PATENT DOCUMENTS 9,654,752 B2    5/2017    Baraniuk et al.
10,924,755 B2   2/2021    Ren et al.
(Continued)

OTHER PUBLICATIONS

Arbeláez, P. et al., "Contour Detection and Hierarchical Image Segmentation," IEEE Transactions on Pattern Analysis and Machine Intelligence, vol. 33, No. 5, May 2011, IEEE, pp. 898-916.
(Continued)

*Primary Examiner* — Joseph J Lauture
(74) *Attorney, Agent, or Firm* — MH2 TECHNOLOGY LAW GROUP LLP

(57) ABSTRACT

A compression ratio (CR) adapter (CRA) for end-to-end data-driven compressive sensing (CS) reconstruction (EDCSR) frameworks is provided. EDCSR frameworks achieve state-of-the-art reconstruction performance in terms of reconstruction speed and accuracy for images and other signals. However, existing EDCSR frameworks cannot adapt to a variable CR. For applications that desire a variable CR, existing EDCSR frameworks must be trained from scratch at each CR, which is computationally costly and time-consuming. Embodiments described herein present a CRA framework that addresses the variable CR problem generally for existing and future EDCSR frameworks with no modification to given reconstruction models nor enormous additional rounds of training needed. The CRA exploits an initial reconstruction network to generate an initial estimate of reconstruction results based on a small portion of acquired image measurements. Subsequently, the CRA approximates full measurements for the main reconstruction network by complementing the sensed measurements with a re-sensed initial estimate.

20 Claims, 5 Drawing Sheets

(51) Int. Cl.
G06N 3/08 (2023.01)
G06N 3/045 (2023.01)
G06N 3/084 (2023.01)
G06N 20/20 (2019.01)

(56) References Cited

U.S. PATENT DOCUMENTS

| | | | |
|---|---|---|---|
| 2008/0137753 | A1 | 6/2008 | He |
| 2008/0216116 | A1 | 9/2008 | Pekonen et al. |
| 2010/0272184 | A1 | 10/2010 | Fishbain et al. |
| 2017/0188813 | A1 | 7/2017 | Arnold et al. |
| 2017/0256033 | A1 | 9/2017 | Tuzel et al. |
| 2018/0174052 | A1 | 6/2018 | Rippel et al. |
| 2019/0251360 | A1 | 8/2019 | Cricri et al. |
| 2019/0318227 | A1 | 10/2019 | Bronstein et al. |
| 2020/0202160 | A1 | 6/2020 | Park et al. |
| 2020/0234406 | A1* | 7/2020 | Ren .................. G06T 5/001 |
| 2020/0294201 | A1 | 9/2020 | Planche et al. |

OTHER PUBLICATIONS

Badrinarayanan, V. et al., "SegNet: A Deep Convolutional Encoder-Decoder Architecture for Image Segmentation", arXiv, (v1, submitted Nov. 2, 2015), 14 pages, arXiv: 1511.00561v1.
Badrinarayanan, V. et al., "SegNet: A Deep Convolutional Encoder-Decoder Architecture for Image Segmentation", arXiv, v2, submitted Dec. 8, 2015), 14 pages, arXiv: 1511.00561v2.
Bahadir, C. et al., "Deep-learning-based Optimization of the Undersampling Pattern in MRI," arXiv:1907.11374v3 [eess.IV], Jun. 18, 2020, 18 pages.
Bahadir, C. et al., "Learning-Based Optimization of the Under-Sampling Pattern in MRI," arXiv:1901.01960v2 [eess.IV], Apr. 30, 2019, 13 pages.
Bahdanau, D. et al., "Neural Machine Translation by Jointly Learning to Align and Translate", arXiv, (v1, submitted Sep. 1, 2014), 15 pages, arXiv:1409.0473v1.
Bahdanau, D. et al., "Neural Machine Translation by Jointly Learning to Align and Translate", arXiv, (v2, submitted Sep. 2, 2014), 15 pages, arXiv:1409.0473v2.
Bahdanau, D. et al., "Neural Machine Translation by Jointly Learning to Algin and Translate", arXiv, (v3, submitted Oct. 7, 2014), 15 pages, arXiv:1409.0473v3.
Bahdanau, D. et al., "Neural Machine Translation by Jointly Learning to Algin and Translate", arXiv, (v4, submitted Dec. 19, 2014), 15 pages, arXiv:1409.0473v4.
Baldassarre, L. et al., "Learning-Based Compressive Subsampling," arXiv: 1510.06188v3 [cs.IT], Mar. 28, 2016, 13 pages.
Beck, A. et al., "A Fast Iterative Shrinkage-Thresholding Algorithm for Linear Inverse Problems," SIAM Journal on Imaging Sciences, vol. 2, Issue 1, 2009, Society for Industrial and Applied Mathematics, pp. 183-202.
Becker, S. et al., "NESTA: A Fast and Accurate First-Order Method for Sparse Recovery," SIAM Journal on Imaging Sciences, vol. 4, No. 1, 2011, Society for Industrial and Applied Mathematics, 39 pages.
Becker, S. et al., "Templates for convex cone problems with applications to sparse signal recovery", Mathematical Programming Computation vol. Jul. 2011, vol. 3, pp. 165-218 <DOI: 10.1007/s12532-011-0029-5>.
Behravan, V. et al., "Rate-Adaptive Compressed-Sensing and Sparsity Variance of Biomedical Signals," 2015 IEEE 12th International Conference on Wearable and Implantable Body Sensor Networks (BSN), Jun. 9-12, 2015, Cambridge, MA, USA, IEEE, 6 pages.
Bevilacqua, M. et al., "Low-Complexity Single-Image Super-Resolution based on Nonnegative Neighbor Embedding," British Machine Vision Conference (BMVC), 2012, pp. 135-1-135.10.
Blumensath, T. et al., "Iterative hard thresholding for compressed sensing," Applied and Computational Harmonic Analysis, vol. 27, Issue 3, 2009, Elsevier Inc., pp. 265-274.

Bora, A. et al., "Compressed Sensing using Generative Models," Proceedings of the 34th International Conference on Machine Learning, PMLR 70, 2017, Sydney, Australia, 10 pages.
Burger, H. et al., "Image Denoising: Can Plain Neural Networks Compete with BM3D", 2012 IEEE Conference on Computer Vision and Machine Learning (Providence, RI, Jun. 16-21, 2012), 2012 [Date Added to IEEE Xplore Jul. 2012], pp. 2392-2399 <DOI:10.1109/CVPR.2012.6247952>.
Candès, E. et al., "Compressed sensing with coherent and redundant dictionaries," Applied and Computational Harmonic Analysis, vol. 31, Issue 1, 2011, Elsevier Inc., pp. 59-73.
Candes, E., "The restricted isometry property and its implications for compressed sensing", Comptes Rendus Mathematique, May 2008 (available online Apr. 2008), vol. 346, No. 9-10, pp. 589-592 <DOI:10.1016/j.crma.2008.03.014>.
Candès, E. et al., "Robust Uncertainty Principles: Exact Signal Reconstruction From Highly Incomplete Frequency Information," IEEE Transactions on Information Theory, vol. 52, No. 2, Feb. 2006, IEEE, pp. 489-509.
Candès, E. et al., "Stable Signal Recovery from Incomplete and Inaccurate Measurements," Communications on Pure and Applied Mathematics, vol. 59, Issue 8, Wiley Periodicals, Inc., 17 pages.
Chen, T., et al., "DeepCoder: A Deep Neural Network Based Video Compression," 2017 IEEE Visual Communications and Image Processing (VCIP), Dec. 10-13, 2017, St. Petersburg, FL, IEEE, 4 pages.
Chen, X. et al., "Mind's eye: A recurrent visual representation for image caption generation", 2015 IEEE Conference on Computer Vision and Pattern Recognition (CVPR) (Boston, MA, Jun. 7-12, 2015), 2015 [Date Added to IEEE Xplore: Oct. 2015], pp. 2422-2431 <DOI:10.1109/CVPR.2015.7298856>.
Cho, K. et al., "Learning Phase Representations using RNN Encoder-Decoder for Statistical Machine Translation", arXiv, (v1, submitted Jun. 3, 2014), 14 pages, arXiv:1406.1078v1.
Cho, K. et al., "Learning Phase Representations using RNN Encoder-Decoder for Statistical Machine Translation", arXiv, (v2, submitted Jul. 24, 2014), 15 pages, arXiv:1406.1078v2.
Cho, K. et al., "Learning Phase Representations using RNN Encoder-Decoder for Statistical Machine Translation", arXiv, (v3, submitted Sep. 3, 2014), 15 pages, arXiv:1406.1078v3.
Cui, Z. et al., "Deep Network Cascade for Image Super-resolution," In Fleet, D. et al., ECCV 2014, Part V, LNCS 8693, Springer International Publishing, pp. 49-64.
Dabov, K. et al., "Image Denoising by Sparse 3-D Transform-Domain Collaborative Filtering," IEEE Transactions on Image Processing, vol. 16, No. 8, Aug. 2007, IEEE, pp. 2080-2095.
Dadkhahi, H. et al., "Masking Schemes for Image Manifolds," 2014 IEEE Workshop on Statistical Signal Processing (SSP), Jun. 29-Jul. 2, 2014, Gold Coast, Australia, IEEE, pp. 252-255.
Daubechies, I. et al., "Iteratively Reweighted Least Squares Minimization for Sparse Recovery," Communications on Pure and Applied Mathematics, vol. LXIII, 0001-0038, 2010, Wiley Periodicals, Inc., 38 pages.
Davenport, M.A., "Random Observations on Random Observations: Sparse Signal Acquisition and Processing," A Thesis Submitted in Partial Fulfillment of the Requirements for the Degree of Doctor of Philosophy, Aug. 2010, Rice University, Houston, Texas, 203 pages.
Davisson, L.D., "Book Reviews: 'Rate Distortion Theory: A Mathematical Basis for Data Compression," IEEE Transactions on Communications, vol. 20, No. 6, Dec. 1972, IEEE, p. 1202.
Denton, E. et al., "Deep Generative Image Models using a Laplacian Pyramid of Adversarial Networks," Advances in Neural Information Processing Systems 28 (NIPS 2015), Proceedings of the 29th Conference on Neural Information Processing Systems (NIPS), Dec. 2015, Montreal, Canada, 9 pages.
Donahue, J. et al., "Long-term Recurrent Convolutional Networks for Visual Recognition and Description," IEEE Conference on Computer Vision and Pattern Recognition (CVPR), Jun. 7-12, 2015, Boston, MA, USA, IEEE, 10 pages.
Dong, W. et al., "Compressive Sensing via Nonlocal Low-Rank Regularization," IEEE Transactions on Image Processing, vol. 23, No. 8, Aug. 2014, IEEE, pp. 3618-3632.

(56) References Cited

OTHER PUBLICATIONS

Dong, C. et al., "Image Super-Resolution Using Deep Convolutional Networks," IEEE Transactions on Pattern Analysis and Machine Intelligence, Jun. 2015, IEEE, 14 pages.

Dong, C. et al., "Learning a Deep Convolutional Network for Image Super-Resolution," In Fleet, D. et al., ECCV 2014, Part IV, LNCS 8692, 2014, Springer International Publishing, pp. 184-199.

Duarte, M.F. et al., "Single-Pixel Imaging via Compressive Sampling," IEEE Signal Processing Magazine, Mar. 2008, IEEE, pp. 83-91.

Duchi, J. et al., "Adaptive Subgradient Methods for Online Learning and Stochastic Optimization," Journal of Machine Learning Research, vol. 12, Jul. 2011, pp. 2121-2159.

Fowler, J.E. et al., "Block-Based Compressed Sensing of Images and Video," Foundations and Trends in Signal Processing, vol. 4, No. 4, 2012, 127 pages.

Gao, Z. et al., "Compressive Sensing Techniques for Next-Generation Wireless Communications," IEEE Wireless Communications, vol. 25, Issue 3, Feb. 8, 2018, IEEE, 10 pages.

Girshick, R. et al., "Rich Feature Hierarchies for Accurate Object Detection and Semantic Segmentation", 2014 EEE Conference on Computer Vision and Pattern Recognition (Columbus, OH, Jun. 23-28, 2014), 2014 [Date Added to IEEE Xplore Sep. 2014], pp. 580-587 <DOI:10.1109/CVPR.2014.81>.

Glasner, D. et al., "Super-Resolution from a Single Image," IEEE 12th International Conference on Computer Vision (ICCV), Sep. 29-Oct. 2, 2009, Kyoto, Japan, IEEE, pp. 349-356.

Gozcu, B. et al., "Learning-Based Compressive MRI," IEEE Transactions on Medical Imaging, vol. 37, No. 6, Jun. 2018, IEEE, pp. 1394-1406.

Graves, A. et al., "Towards End-to-End Speech Recognition with Recurrent Neural Networks", ICML '14: Proceedings of the 31st International Conference on Machine Learning (Beijing, China, Jun. 22-24, 2014), 2014, vol. 32, 9 pages.

Guo, W. et al., "EdgeCS: Edge Guided Compressive Sensing Reconstruction," Proceedings of SPIE Visual Communications and Image Processing 2010, vol. 7744, 77440L-1, Jul. 2010, Huangshan, China, SPIE, 10 pages.

He, K. et al., "Deep Residual Learning for Image Recognition," 2016 IEEE Conference on Computer Vision and Pattern Recognition (CVPR), Jun. 27-30, 2016, Las Vegas, NV, USA, IEEE, pp. 770-778.

Hinton, G. et al., "Deep Neural Networks for Acoustic Modeling in Speech Recognition: The Shared Views of Four Research Groups", IEEE Signal Processing Magazine, Nov. 2012 (Date of Publication Oct. 2012), vol. 29, No. 6, pp. 82-97 <DOI:10.1109/MSP.2012.2205597>.

Hinton, G. et al., "Reducing the Dimensionality of Data with Neural Networks", Science, Jul. 2006, vol. 313, No. 5786, pp. 504-507 <DOI:10.1126/science.1127647>.

Hong, T. et al., "Optimized structured sparse sensing matrices for compressive sensing," Signal Processing, vol. 159, Jun. 2019, Elsevier, pp. 119-129.

Huijben, B.S. et al., "Deep Probabilistic Subsampling forTask-Adaptive Compressed Sensing," Eighth International Conference on Learning Representations (ICLR 2020), Apr. 26-May 1, 2020, 16 pages.

Huggins, P.S. et al., "Greedy Basis Pursuit," IEEE Transactions on Signal Processing, vol. 55, No. 7, Jul. 2007, IEEE, pp. 3760-3772.

Iliadis, M. et al., " Deep Fully-Connected Networks for Video Compressive Sensing", arXiv, (v1, submitted Mar. 16, 2016), 13 pages, arXiv:1603.04930v1.

Iliadis, M. et al., "Deep fully-connected networks for video compressive sensing," Digital Signal Processing, vol. 72, Jan. 2018, Elsevier Inc., pp. 9-18.

Ioffe, S. et al., "Batch Normalization: Accelerating Deep Network Training by Reducing Internal Covariate Shift," Proceedings of the 32nd International Conference on Machine Learning, 2015, Lille, France, 9 pages.

Karpathy, A. et al., "Large-Scale Video Classification with Convolutional Neural Networks", 2014 IEEE Conference on Computer Vision and Patter Recognition (Columbus, OH, Jun. 23-28, 2014), 2014 [Date Added to IEEE Xplore: Sep. 2014], pp. 1725-1732 <DOI:10.1109/CVPR.2014.223>.

Kim, J. et al., "Accurate Image Super-Resolution Using Very Deep Convolutional Networks," 2016 IEEE Conference on Computer Vision and Pattern Recognition (CVPR), Jun. 27-30, 2016, Las Vegas, NV, USA, IEEE, pp. 1646-1654.

Kin, C., et al., "Video Compression Using Recurrent Convolutional Neural Networks," 2017, available at http://cs231n.stanford.edu/reports/2017/pdfs/423.pdf, 6 pages.

Kingma, D. et al., "Adam: A Method for Stochastic Optimization," arXiv: 1412.6980v9, Jan. 30, 2017, published as a conference paper at ICLR 2015, 15 pages.

Krizhevsky, A. et al., "ImageNet Classification with Deep Convolutional Neural Networks", Advances in Neural Information Processing Systems (NIPS 2012), 2012, vol. 25, 9 pages.

Krizhevsky, A., "Learning Multiple Layers of Features from Tiny Images," Apr. 8, 2009, available online at https://www.cs.toronto.edu/~kriz/learning-features-2009-TR.pdf, 60 pages.

Kulkarni, K. et al., "ReconNet: Non-Iterative Reconstruction of Images from Compressively Sensed Measurements," 2016 IEEE Conference on Computer Vision and Pattern Recognition (CVPR), Jun. 2016, IEEE, 10 pages.

Lai, W.S. et al., "Deep Laplacian Pyramid Networks for Fast and Accurate Super-Resolution," 2017 IEEE Conference on Computer Vision and Pattern Recognition (CVPR), Jul. 21-26, 2017, Honolulu, HI, USA, IEEE, pp. 5835-5843.

Lecun, Y. et al., "Efficient BackProp," In Montavon, G. et al., Neural Networks: Tricks of the Trade, 2nd edition, LNCS 7700, 2012, Springer-Verlag, pp. 9-48.

Leinonen, M. et al., "Distributed Variable-Rate Quantized Compressed Sensing in Wireless Sensor Networks," IEEE 17th International Workshop on Signal Processing Advances in Wireless Communications (SPAWC), Jul. 3-6, 2016, Edinburgh, United Kingdom, IEEE, 5 pages.

Li, C. et al., "An efficient augmented Lagrangian method with applications to total variation minimization," Computational Optimization and Applications, vol. 56, Issue 3, Dec. 2013, Springer Science+Business Media, 24 pages.

Li, D. et al., "DeepRebirth: Accelerating Deep Neural Network Execution on Mobile Devices," The Thirty-Second AAAI Conference on Artificial Intelligence (AAAI-18), 2018, Association for the Advancement of Artificial Intelligence, pp. 2322-2330.

Li, D. et al., "DeepRebirth: Accelerating Deep Neural Network Execution on Mobile Devices", arXiv, (v1, submitted Aug. 16, 2017), 9 pages, https://arxiv.org/abs/1708.04728v1.

Lohit, S. et al., "Convolutional Neural Networks for Noniterative Reconstruction of Compressively Sensed Images," IEEE Transactions on Computational Imaging, vol. 4, No. 3, Sep. 2018, IEEE, pp. 326-340.

Lohit, S. et al., "Rate-Adaptive Neural Networks forSpatial Multiplexers," arXiv:1809.02850v1 [cs.CV], Sep. 8, 2018, 12 pages.

Long, J. et al., "Fully Convolutional Networks for Semantic Segmentation", arXiv, (v1, submitted Nov. 14, 2014), 10 pages, arXiv:1411.4038v1.

Long, J. et al., "Fully Convolutional Networks for Semantic Segmentation", arXiv, (v2, submitted Mar. 8, 2015), 10 pages, arXiv:1411.4038.

Ma, S. et al., "An Efficient Algorithm for Compressed MR Imaging using Total Variation and Wavelets," IEEE Conference on Computer Vision and Pattern Recognition (CVPR), Jun. 23-28, 2008, Anchorage, AK, USA, 8 pages.

Ma, S. et al., "Learning Activity Progression in LSTMs for Activity Detection and Early Detection", 2016 IEEE Conference on Computer Vision and Pattern Recognition (Las Vegas, NV, Jun. 27-30, 2016), 2016 [Date Added to IEEE Xplore: Dec. 2016], pp. 1942-1950 <DOI:10.1109/CVPR.2016.214>.

Metzler, C.A. et al., "From Denoising to Compressed Sensing," IEEE Transactions on Information Theory, vol. 62, No. 9, Sep. 2016, IEEE, pp. 5117-5144.

(56) References Cited

OTHER PUBLICATIONS

Metzler, C.A., "Learned D-AMP: Principled Neural Network Based Compressive Image Recovery," 31st Conference on Neural Information Processing Systems (NIPS 2017), Dec. 4-9, 2017, Long Beach, CA, USA, 12 pages.

Mousavi, A. et al., "DeepCodec: Adaptive Sensing and Recovery via Deep Convolutional Neural Networks," arXiv:1707.03386v1 [stat.ML], Jul. 11, 2017, 8 pages.

Mousavi, A. et al., "A Data-Driven and Distributed Approach to Sparse Signal Representation and Recovery," 7th International Conference on Learning Representations (ICLR 2019), May 6-9, 2019, New Orleans, LA, USA, 13 pages.

Mousavi, A. et al., "A Deep Learning Approach to Structured Signal Recovery," arXiv: 1508.04065v1, Aug. 17, 2015, 8 pages.

Mousavi, A. et al., "Learning to Invert: Signal Recovery via Deep Convolutional Networks," 2017 IEEE International Conference on Acoustics, Speech and Signal Processing (ICASSP), Mar. 5-9, 2017, New Orleans, LA, USA, IEEE, pp. 2272-2276.

Mun, S. et al., "Motion-Compensated Compressed-Sensing Reconstruction for Dynamic MRI", 2013 IEEE International Conference on Image Processing (Melbourne, Australia, Sep. 15-18, 2013), 2013 [Date Added to IEEE Xplore: Feb. 2014], pp. 1006-1010 <DOI:10.1109/ICIP.2013.6738208>.

Nam, S. et al., "The cosparse analysis model and algorithms," Applied and Computational Harmonic Analysis, vol. 34, Issue 1, Jan. 2013, Elsevier Inc., pp. 30-56.

Needell, D. et al., "CoSaMP: Iterative Signal Recovery from Incomplete and Inaccurate Samples," Communications of the ACM, vol. 53, No. 12, Dec. 2010, pp. 93-100.

Ng, J. et al., "Beyong Short Snippets: Deep Networks for Video Classification", 2015 IEEE Conference on Computer Vision on Pattern Recognition (Boston, MA, Jun. 7-12, 2015), 2015 [Date Added to IEEE Xplore: Oct. 2015], pp. 4694-4702 <DOI:10.1109/CVPR.2015.7299101>.

Nguyen, D. et al., "Deep Learning Sparse Ternary Projections for Compressed Sensing of Images," 2017 IEEE Global Conference on Signal and Information Processing (GlobalSIP), Nov. 14-16, 2017, Montreal, QC, Canada, IEEE, pp. 1125-1129.

Noh, H. et al., "Image Question Answering Using Convolutional Neural Network with Dynamic Parameter Prediction", 2016 IEEE Conference on Computer Vision and Pattern Recognition (Las Vegas, NV, Jun. 27-30, 2016), 2016 [Date Added to IEEE Xplore: Dec. 2016], pp. 30-38 <DOI: 10.1109/CVPR.2016.11>.

Noh, H. et al., "Learning Deconvolution Network for Semantic Segmentation," IEEE International Conference on Computer Vision (ICCV), 2015, IEEE, pp. 1520-1528.

Oquab, M. et al., Is Object Localization for Free?—Weakly-Supervised Learning with Convolutional Neural Networks, 2015 IEEE Conference on Computer Vision and Pattern Recognition (Boston, MA, Jun. 7-12, 2015), 2015 [Date Added to IEEE Xplore: Oct. 2015], pp. 685-694 <DOI: 10.1109/CVPR.2015.7298668>.

Pathak, D. et al., "Context Encoders: Feature Learning by Inpainting," 2016 IEEE Conference on Computer Vision and Pattern Recognition (CVPR), Jun. 27-30, 2016, Las Vegas, NV, USA, IEEE, pp. 2536-2544.

Pan, P. et al., "Hierarchical Recurrenet Neural Encoder for Video Representation with Application to Captioning," Nov. 2015, available at https://arxiv.org/abs/1511.03476, 10 pages.

Paszke, A. et al., "Automatic differentiation in PyTorch," 31st Conference on Neural Information Processing Systems (NIPS 2017), Dec. 4-9, 2017, Long Beach, CA, USA, 4 pages.

Qaisar, S. et al., "Compressive Sensing: From Theory to Applications, a Survey", Journal of Communications and Networks, Oct. 2013 (Date of Publication Nov. 2013), vol. 15, No. 5, pp. 443-456 <DOI:10.1109/JCN.2013.000083>.

Radford, A. et al., "Unsupervised Representation Learning with Deep Convolutional Generative Adversarial Networks," arXiv: 1511.06434v2, Jan. 7, 2016, 16 pages.

Safavi, S. et al., "Sparsity-aware adaptive block-basedcompressive sensing," IET Signal Processing, Jul. 2016, The Institution of Engineering and Technology, 7 pages.

Sankaranarayanan, A. et al., "Compressive Acquisition of Linear Dynamical Systems," SIAM Journal on Imaging Sciences, vol. 6, No. 4, 2013, Society for Industrial and Applied Mathematics, pp. 2109-2133.

Sankaranarayanan, A. et al., "CS-MUVI: Video Compressive Sensing for Spatial-Multiplexing Cameras", 2012 IEEE International Conference on Computational Photography (Seattle, WA, Apr. 28-29, 2012), 2012 [Date Added to IEEE Xplore: Jun. 2012], 10 pages <DOI: 10.1109/ICCPhot.2012.6215212>.

Sankaranarayanan, A. et al., "Video Compressive Sensing for Spatial Multiplexing Cameras Using Motion-Flow Models," SIAM Journal on Imaging Sciences, vol. 8, No. 3, 2015, Society for Industrial and Applied Mathematics, pp. 1489-1518.

Schulter, S. et al., "Fast and Accurate Image Upscaling with Super-Resolution Forests," 2015 IEEE Conference on Computer Vision and Pattern Recognition (CVPR), Jun. 7-12, 2015, Boston, MA, USA, IEEE, pp. 3791-3799.

Sharma, S. et al., "Action Recognition using Visual Attention", arXiv, (v1, submitted Nov. 12, 2015), 11 pages, arXiv:1511.04119v1.

Shi, W. et al., "Scalable Convolutional Neural Network for Image Compressed Sensing," 2019 IEEE/CVF Conference on Computer Vision and Pattern Recognition (CVPR), Jun. 15-20, 2019, Long Beach, CA, USA, IEEE, pp. 12290-12299.

Snoek, C. et al., "Early versus Late Fusion in Semantic Video Analysis," Proceedings of the 13th ACM International Conference on Multimedia (MM), Nov. 6-11, 2005, Singapore, ACM, 4 pages.

Soomro, K. et al., "UCF101: A Dataset of 101 Human Actions Classes From Videos in the Wild," CRCV-TR-12-01, Nov. 2012, Center for Research in Computer Vision, University of Central Florida, USA, 7 pages.

Srivastava, N. et al., "Unsupervised Learning of Video Representations using LSTMs," Proceedings of the 32nd International Conference on Machine Learning (ICML), 2015, Lille, France, 10 pages.

Toderici, G., et al., "Full Resolution Image Compression with Recurrent Neural Networks," Jul. 2017, available at https://arxiv.org/abs/1608.05148, 9 pages.

Tropp, J. et al., "Signal Recovery From Random Measurements via Orthogonal Matching Pursuit," IEEE Transactions on Information Theory, vol. 53, No. 12, Dec. 2007, IEEE, pp. 4655-4666.

Van Veen, D. et al., "Compressed Sensing with Deep Image Prior and Learned Regularization," arXiv: 1806.06438v1 [stat.ML], Jun. 17, 2018, 18 pages.

Venugopalan, S. et al., "Sequence to Sequence—Video to Text," IEEE International Conference on Computer Vision (ICCV), Dec. 11-18, 2015, Santiago, Chile, IEEE, pp. 4534-4542.

Wang, Y. et al., "Data-Driven Sampling Matrix Boolean Optimization for Energy-Efficient Biomedical Signal Acquisition by Compressive Sensing," IEEE Transactions on Biomedical Circuits and Systems, vol. 11, No. 2, Nov. 14, 2016, IEEE, pp. 255-266.

Wang, Z. et al., "Image Quality Assessment: From Error Visibility to Structural Similarity," IEEE Transactions on Image Processing, vol. 13, No. 4, Apr. 2004, IEEE, 14 pages.

Weiss, T. et al., "Learning Fast Magnetic Resonance Imaging," arXiv:1905.09324v1 [eess.IV], May 22, 2019, 12 pages.

Wu, Y. et al., "Deep Compressed Sensing," arXiv:1905.06723v2 [cs.LG], May 18, 2019, 11 pages.

Wu, S. et al., "Learning a Compressed Sensing Measurement Matrix via Gradient Unrolling," arXiv:1806.10175v4 [stat.ML], Jul. 2, 2019, 17 pages.

Xie, J. et al., "Image Denoising and Inpainting with Deep Neural Networks", Advances in Neural Information Processing Systems (NIPS 2012), 2012, vol. 25, 9 pages.

Xie, R. et al., "Transmission Efficient Clustering Method for Wireless Sensor Networks using Compressive Sensing," IEEE Transactions on Parallel and Distributed Systems, vol. 25, Issue 3, Mar. 2014, IEEE, 11 pages.

Xu, K. et al., "A Data-Driven Compressive Sensing Framework Tailored for Energy-Efficient Wearable Sensing," The 42nd IEEE

(56) References Cited

OTHER PUBLICATIONS

International Conference on Acoustics, Speech and Signal Processing (ICASSP), Mar. 2017, IEEE, 6 pages.

Xu, K. et al., "An energy-efficient compressive sensing framework incorporating online dictionary learning for long-term wireless health monitoring", 2016 IEEE International Conference on Acoustics, Speech and Signal Processing (ICASSP) (Shanghai, China, Mar. 20-25, 2016), 2016 [Date Added to IEEE Xplore: May 2016], pp. 804-808 <DOI:10.1109/ICASSP.2016.7471786>.

Xu, K. et al., "CSVideoNet: A Real-Time End-to-End Learning Framework for High-Frame-Rate Video Compressive Sensing", 2018 IEEE Winter Conference on Applications of Computer Vision (WACV) (Lake Tahoe, NV, Mar. 12-15, 2018), 2018 [Date Added to IEEE Xplore: May 2018], pp. 1680-1688 <DOI:10.1109/WACV.2018.00187>.

Xu, K. et al., "CSVideoNet: A Real-Time End-to-End Learning Framework for High-Frame-Rate Video Compressive Sensing", Researchgate, May 2017 (uploaded Apr. 2017), 11 pages <https://www.researchgate.net/publication/315783235_CSVideoNet_A_Real-time_End-to-end_Learning_Framework_for_High-frame-rate_Video_Compressive_Sensing>.

Xu, K. et al., "CSVideoNet: A Real-time End-to-end Learning Framework for High-frame-rate Video Compressive Sensing", arXiv, (v3, submitted Mar. 20, 2017), 11 pages, arXiv:1612.05203v3.

Xu, K. et al., "CSVideoNet: A Real-time End-to-end Learning Framework for High-frame-rate Video Compressive Sensing", arXiv, (v4, submitted Apr. 5, 2017), 11 pages, arXiv:1612.05203v4.

Xu, K. et al., "CSVideoNet: A Real-time End-to-end Learning Framework for High-frame-rate Video Compressive Sensing", arXiv, (v5, submitted Jan. 28, 2018), 9 pages, arXiv:1612.05203v5.

Xu, K. et al., "CSVideoNet: A Recurrent Convolutional Neural Network for Compressive Sensing Video Reconstruction", arXiv, (v1, submitted Dec. 15, 2016), 10 pages, arXiv:1612.05203v1.

Xu, K. et al., "CSVideoNet: A Recurrent Convolutional Neural Network for Compressive Sensing Video Reconstruction", arXiv, (v2, submitted Dec. 16, 2016), 10 pages, arXiv:1612.05203v2.

Xu, K. et al., "LAPRAN: A Scalable Laplacian Pyramid Reconstructive Adversarial Network for Flexible Compressive Sensing Reconstruction", European Conference on Computer Vision 2018 (Munich, Germany, Sep. 8-14, 2018), Oct. 2018, vol. 11214, pp. 491-507 <DOI:10.1007/978-3-030-01249-6_30>.

Xu, K. et al., "LAPRAN: A Scalable Laplacian Pyramid Reconstructive Adversarial Network for Flexible Compressive Sensing Reconstruction", arXiv, (v1, submitted Jul. 24, 2018), 16 pages, arXiv:1807.09388v1.

Xu, K. et al., "LAPRAN: A Scalable Laplacian Pyramid Reconstructive Adversarial Network for Flexible Compressive Sensing Reconstruction", arXiv, (v2, submitted Jul. 28, 2018), 16 pages, arXiv:1807.09388v2.

Xu, K. et al., "LAPRAN: A Scalable Laplacian Pyramid Reconstructive Adversarial Network for Flexible Compressive Sensing Reconstruction", arXiv, (v3, submitted Nov. 28, 2018), 17 pages, arXiv: 1807.09388v3.

Xu, K. et al., "Show, Attend and Tell: Neural Image Caption Generation with Visual Attention," Proceedings of the 32nd International Conference on Machine Learning, 2015, Lille, France, 10 pages.

Yang, J. et al., "Image Super-Resolution via Sparse Representation," IEEE Transactions on Image Processing, vol. 19, No. 11, Nov. 2010, IEEE, pp. 2861-2873.

Yang, J. et al., "Video Compressive Sensing Using Gaussian Mixture Models," IEEE Transactions on Image Processing, vol. 23, No. 11, Nov. 2014, pp. 4863-4878.

Yang, Y. et al., "Deep ADMM-Net for Compressive Sensing MRI," 30th Conference on Neural Information Processing Systems (NIPS 2016), Dec. 2016, Barcelona, Spain, pp. 10-18.

Yang, Z. et al., "Stacked Attention Networks for Image Question Answering", 2016 IEEE Conference on Computer Vision and Pattern Recognition (Las Vegas, NV, Jun. 27-30, 2016), 2016 [Date Added to IEEE Xplore: Dec. 2016], pp. 21-29 <DOI:10.1109/CVPR.2016.10>.

Yao, H. et al., "DR 2-Net: Deep Residual Reconstruction Network for image compressive sensing," Neurocomputing, vol. 359, No. 11, Jun. 2019, Elsevier B.V., pp. 483-493.

Yuan, X. et al., "Parallel lensless compressive imaging via deep convolutional neural networks," Optics Express, vol. 26, No. 2, Jan. 22, 2018, Optical Society of America, 16 pages.

Zeiler, M. et al., "Adaptive Deconvolutional Networks for Mid and High Level Feature Learning," 2011 IEEE International Conference on Computer Vision (ICCV), Nov. 6-13, 2011, Barcelona, Spain, IEEE, 8 pages.

Zeiler, M. et al., "Visualizing and Understanding Convolutional Networks," In Fleet et al., ECCV 2014, Part I, LNCS 8689, Springer International Publishing, pp. 818-833.

Zeyde, R. et al., "On Single Image Scale-Up Using Sparse-Representations," In Boissonnat, J.D. et al., Curves and Surfaces 2011, LNCS 6920, 2012, Springer-Verlag, pp. 711-730.

Zhang, Z. et al., "ISTA-Net: Interpretable Optimization-Inspired Deep Network for Image Compressive Sensing," 2018 IEEE/CVF Conference on Computer Vision and Pattern Recognition, Jun. 18-23, 2018, Salt Lake City, UT, USA, IEEE, pp. 1828-1837.

Zhao, W. et al., "On-Chip Neural Data Compression Based on Compressed Sensing With Sparse Sensing Matrices," IEEE Transactions on Biomedical Circuits and Systems, vol. 12, No. 1, Feb. 2018, IEEE, pp. 242-254.

Zuo, Z. et al., "Learning Contextual Dependence with Convolutional Hierarchical Recurrent Neural Networks," Jul. 2016, IEEE Transactions on Image Processing, vol. 25, No. 7, pp. 2983-2996.

Non-Final Office Action for U.S. Appl. No. 16/165,568, dated Mar. 18, 2020, 15 pages.

Applicant-Initiated Interview Summary for U.S. Appl. No. 16/165,568, dated Jun. 8, 2020, 3 pages.

Notice of Allowance for U.S. Appl. No. 16/165,568, dated Oct. 5, 2020, 9 pages.

Non-Final Office Action for U.S. Appl. No. 16/745,817, dated Mar. 23, 2022, 12 pages.

* cited by examiner

GENERIC COMPRESSION RATIO ADAPTER FOR END-TO-END DATA-DRIVEN COMPRESSIVE SENSING RECONSTRUCTION FRAMEWORKS

RELATED APPLICATIONS

This application claims the benefit of provisional patent application Ser. No. 63/002,770, filed Mar. 31, 2020, the disclosure of which is hereby incorporated herein by reference in its entirety.

GOVERNMENT SUPPORT

This invention was made with government support under 1652038 awarded by the National Science Foundation. The government has certain rights in the invention.

FIELD OF THE DISCLOSURE

This disclosure relates to compressive sensing (CS) reconstruction of signals, such as images.

BACKGROUND

Internet-of-things (IoT) devices are becoming increasingly pervasive and far-reaching in society. IoT devices allow objects to be sensed, monitored, controlled, and actuated remotely across existing network infrastructure, creating opportunities for more direct integration of the physical and digital worlds, and resulting in economic and societal benefits for a wide range of applications. While the IoT revolution brings unprecedented opportunities for economic growth and societal benefits, it also presents emergent challenges to the existing computational infrastructure. The emergent IoT data explosion will inevitably exert a tremendous data transmission burden onto wireless edge networks, which are often low-power wide-area networks (LPWAN) with very limited bandwidth.

Compressive sensing (CS) is a transformative sampling technique that allows sparse signals to be sampled in compressed form at a rate much lower than the Nyquist rate, significantly reducing cost in signal sensing. CS is a signal sensing technique that senses signals in a compressed manner to save sensing and transmission costs. The sensing in CS is a simple linear mapping of the original signal, but the reconstruction in CS is a complicated inverse problem. Most conventional CS reconstruction methods formulate the reconstruction process as an optimization problem and search for the solution iteratively. Conventional CS reconstruction techniques come with three drawbacks in imaging applications: (1) high complexity of iterative signal reconstruction, (2) dependency on known signal sparsity which often does not apply to natural images, and (3) rigid, fixed-resolution reconstructions.

Deep neural networks (DNNs) have been explored for direct CS image reconstruction. End-to-end data-driven CS reconstruction (EDCSR) frameworks use DNNs to achieve state-of-the-art results in terms of reconstruction speed and reconstruction accuracy compared with other CS reconstruction methods. However, a major limitation of existing EDCSR frameworks is that they can only perform reconstruction at fixed compression ratios (CRs) once they are trained. For reconstruction at a different CR, an EDCSR framework must be trained at that CR from scratch, which greatly limits their application in variable CR scenarios. Allowing for a variable CR that can be adaptive to the available battery level, storage space, or communication bandwidth at run time is critical to many resource-constrained CS applications, such as in IoT applications.

SUMMARY

A compression ratio (CR) adapter (CRA) for end-to-end data-driven compressive sensing (CS) reconstruction (EDCSR) frameworks is provided. EDCSR frameworks achieve state-of-the-art reconstruction performance in terms of reconstruction speed and accuracy for images and other signals. However, due to their end-to-end nature, existing EDCSR frameworks cannot adapt to a variable CR. For applications that desire a variable CR, existing EDCSR frameworks must be trained from scratch at each CR, which is computationally costly and time-consuming. Embodiments described herein present a CRA framework that addresses the variable CR problem generally for existing and future EDCSR frameworks with no modification to given reconstruction models nor enormous additional rounds of training needed.

The CRA exploits an initial reconstruction network to generate an initial estimate of reconstruction results based on a small portion of acquired image measurements. Subsequently, the CRA approximates full measurements for the main reconstruction network by complementing the sensed measurements with a re-sensed initial estimate. Evaluations based on two public image datasets (CIFAR10 and Set5) show that the CRA provides an average of 13.02 decibel (dB) and 5.38 dB peak signal-to-noise ratio (PSNR) improvement across the CRs from 5 to 30 over a naive zero-padding approach and the AdaptiveNN approach of a prior work, respectively. The CRA addresses the fixed-CR limitation of existing EDCSR frameworks and makes them suitable for resource-constrained CS applications.

An exemplary embodiment provides a method for adapting a CS framework for a variable CR. The method includes generating a first reconstruction of an original signal based on a portion of first compressive measurements of the original signal; and generating a second reconstruction of the original signal based on the first compressive measurements and second compressive measurements of the first reconstruction.

Another exemplary embodiment provides a CRA. The CRA includes a first reconstruction network configured to generate a first reconstruction of an original signal based on a portion of first compressive measurements of the original signal. The CRA further includes a second reconstruction network configured to generate a second reconstruction of the original signal based on the first compressive measurements and second compressive measurements of the first reconstruction.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
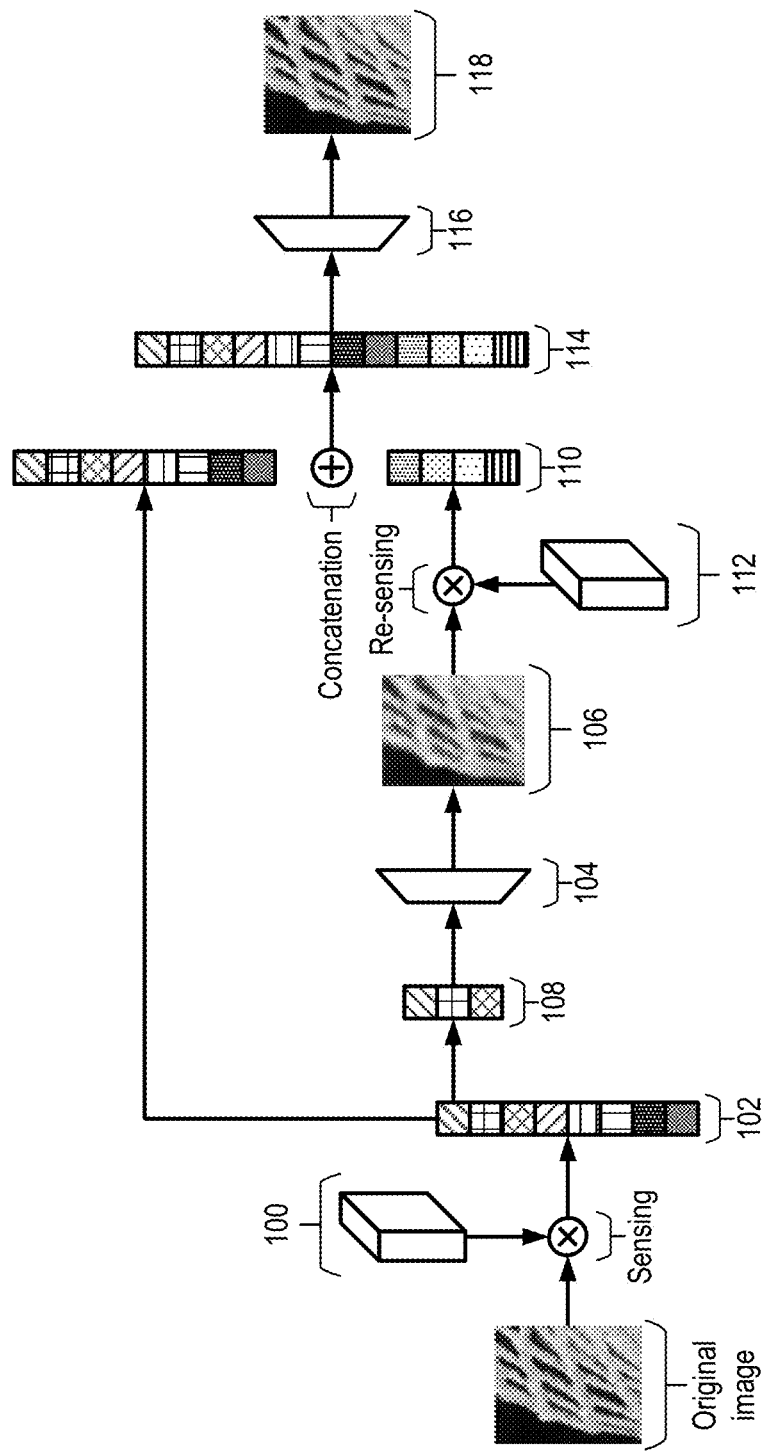
FIG. 1 is a schematic diagram of an exemplary data flow of a sensing and reconstruction process for a compression ratio adapter (CRA) according to embodiments described herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A compression ratio (CR) adapter (CRA) for end-to-end data-driven compressive sensing (CS) reconstruction (EDCSR) frameworks is provided. EDCSR frameworks achieve state-of-the-art reconstruction performance in terms of reconstruction speed and accuracy for images and other signals. However, due to their end-to-end nature, existing EDCSR frameworks cannot adapt to a variable CR. For applications that desire a variable CR, existing EDCSR frameworks must be trained from scratch at each CR, which is computationally costly and time-consuming. Embodiments described herein present a CRA framework that addresses the variable CR problem generally for existing and future EDCSR frameworks with no modification to given reconstruction models nor enormous additional rounds of training needed.

The CRA exploits an initial reconstruction network to generate an initial estimate of reconstruction results based on a small portion of acquired image measurements. Subsequently, the CRA approximates full measurements for the main reconstruction network by complementing the sensed measurements with a re-sensed initial estimate. Evaluations based on two public image datasets (CIFAR10 and Set5) show that the CRA provides an average of 13.02 decibel (dB) and 5.38 dB peak signal-to-noise ratio (PSNR) improvement across the CRs from 5 to 30 over a naive zero-padding approach and the AdaptiveNN approach of a prior work, respectively. The CRA addresses the fixed-CR limitation of existing EDCSR frameworks and makes them suitable for resource-constrained CS applications.

I. Introduction

In embodiments described herein, the concept of estimate re-sensing is applied to empower EDCSR frameworks with adaptability to a variable CR. This approach is structured as a generic CRA that can be independently applied to the existing EDCSR frameworks with no modification to a given reconstruction model nor enormous rounds of training needed. As used herein, "EDCSR framework" refers to any CS reconstruction framework which provides an end-to-end solution, with end-to-end referring to a solution which receives sensed measurements of a signal and outputs a reconstructed signal in a single feed-forward data flow rather than iteratively reconstruct a signal from its measurements by a number of iterations. Given user-defined lower and upper bounds of the CR, the CRA exploits an initial reconstruction network which is trained at the highest CR to generate an initial estimate of reconstruction results with the sensed measurements. Subsequently, the CRA approximates full measurements for the main reconstruction network, which is trained at the lowest CR, by complementing the sensed measurements available at any intermediate CR with a re-sensed initial estimate.

As such, the CRA can enable flexible reconstruction with an arbitrary number of measurements and extend the supported CR to user-defined lower and upper bounds at a fine granularity. The main advantage of the CRA is that it is generic to the underlying reconstruction approach (e.g., machine learning approach, such as a neural network) and provides an approximately linear trade-off between the number of measurements and the reconstruction accuracy for all EDCSR frameworks.

The contributions of this approach are two-fold. First, a simple yet effective approach is proposed to empower EDCSR frameworks with adaptability to a variable CR, which makes them suitable for resource-constrained CS application scenarios. The proposed CRA significantly improves the reconstruction accuracy of the existing EDCSR frameworks in the context of a variable CR compared to a naive zero-padding approach and the prior work. Second, this approach is generic for all EDCSR frameworks and can empower them to deal with a variable CR at run time with no modification to the given network model nor enormous training time needed.

A. Iterative Reconstruction Methods

Most of the existing reconstruction methods of CS are iterative reconstruction methods. Iterative reconstruction methods can inherently adapt to a variable CR but are limited by their low reconstruction speed due to their iterative nature (as opposed to end-to-end solutions) as well as low reconstruction accuracy at high CRs. Most of the iterative reconstruction methods have lower reconstruction accuracy at high CRs compared with EDCSR methods.

B. Rate-Adaptive Neural Network (AdaptiveNN)

AdaptiveNN (as described in Suhas Lohit, Rajhans Singh, Kuldeep Kulkarni, and Pavan Turaga, "Rate-Adaptive Neural Networks for Spatial Multiplexers," arXiv preprint, arXiv:1809.02850, 2018) is the only work so far that aims to solve the variable CR problem for EDCSR frameworks. AdaptiveNN proposes to constrain the first layer of an EDCSR framework to be the pseudo inverse of the sensing matrix during the training. The main limitations of AdaptiveNN are low reconstruction accuracy, long training time needed, and the lack of generality to multiple EDCSR frameworks. Overcoming these limitations, the proposed CRA approach achieves more than 20% higher reconstruction accuracy (described below with respect to FIGS. 3A and 3B) with 75× less training time (see Table 1 below) compared to AdaptiveNN. Moreover, the CRA is generic and can be applied to all EDCSR frameworks.

II. Methodology

Gaussian random sensing matrices are used herein, as they are the most widely used sensing matrices in CS related studies. It should be understood that the use of different sensing matrices is within the scope of the present disclosure. Using Gaussian random sensing matrices for illustrative purposes, it can be assumed that the original signal is an n-dimensional vector $X=[x_1, \ldots, x_n]$. The user-defined lower and upper bounds of CR are $$CR_{min} = \frac{n}{m_{max}},$$

$$CR_{max} = \frac{n}{m_{min}}.$$

Conventionally, for a signal that has to be sensed at the $$CR\frac{n}{m},$$

$m_{min} \leq m \leq m_{max}$, the sensing step is a linear transformation of the signal, i.e. $Y=AX$, where A denotes a sensing matrix in the size of m by n, and $Y=[y_1, \ldots, y_m]$ denotes the compressively sensed measurements of X. The corresponding EDCSR network that is trained at the CR n/m with A is essentially a high-dimensional, vector-valued function that maps an m-dimensional space to an n-dimensional space, i.e., $\hat{X}=f(Y,\Theta)$, where $f$ is the reconstruction framework with trainable parameters $\Theta$, and $\hat{X}=[\hat{x}_1, \ldots, \hat{x}_n]$ is the reconstruction result. The sensing matrix A is predefined before the training of $f$ and the trainable parameters $\Theta$ are fixed once the network is trained.

FIG. 1 is a schematic diagram of an exemplary data flow of a sensing and reconstruction process for a CRA according to embodiments described herein. A random sensing matrix A in the size of $m_{max}$ by n is predefined. Two EDCSR frameworks named initial reconstruction network ($f_{init}$) and main reconstruction network ($f_{main}$) are pre-trained at $CR_{max}$ and $CR_{min}$ with the first $m_{min}$ rows of A and all rows of A, respectively. For performing the sensing and reconstruction of a signal X at arbitrary CR=n/m between $CR_{min}$ and $CR_{max}$, the first m rows of A (block 100) are used to sense X to get measurements $Y=[y_1, \ldots, y_m]$ (block 102).

The CRA adopts $f_{init}$ (block 104) to generate an initial estimate $X'=[x'_1, \ldots, x'_n]$ (block 106) of the signal by taking the first $m_{min}$ sensed measurements $Y_{1 \to m_{min}}=[y_1, \ldots, y_{m_{min}}]$ (block 108) as input. Subsequently, $m_{max}$–m additional pseudo measurements $Y'_{m+1 \to m_{max}}=[y'_{m+1}, \ldots, y'_{m_{max}}]$ (block 110) of the signal X are generated by re-sensing the initial estimate X' with the last $m_{max}$–m rows of A (block 112). Finally, the full measurements at the $CR_{min}$ are approximated by concatenating sensed measurements $Y_{1 \to m}$ and pseudo measurements $Y'_{m+1 \to m_{max}}$ to $Y=[y_1, \ldots, y_m, y'_{m+1}, \ldots, y'_{m_{max}}]$ (block 114). As such, regardless of the CR at run-time, the CRA can always provide approximated full measurements Y that can be directly fed into $f_{main}$ (block 116) for the final reconstruction of the signal, i.e., $\hat{X}=f_{main}(\hat{Y}, \Theta)$ (block 118).

In other words, a process for adapting a CS framework for a variable CR optionally begins with generating first compressive measurements (block 102) of an original signal (e.g., original image or other CS data) by compressively sensing the original signal (block 100). In some embodiments, the first compressive measurements are received by the CRA rather than generated by the CRA. The process continues with generating a first reconstruction (block 106) of the original signal based on a portion of the first compressive measurements (block 108). The first reconstruction can be generated using machine learning, such as with a first neural network (block 104).

The process continues with generating a second reconstruction (block 118) of the original signal based on the first compressive measurements (block 102) and second compressive measurements of the first reconstruction (block 110). The second compressive measurements can be generated by compressively sensing the first reconstruction (block 112). The second reconstruction can be generated using machine learning, such as with a second neural network (block 116). An input of the second neural network can be a concatenation of the first compressive measurements and the second compressive measurements (block 114).

Advantageously, the process of the CRA is designed such that the first neural network (which may be an initial neural network) and the second neural network (which may be a main or final neural network) can use any EDCSR framework. In some examples, the first neural network and the second neural network use a common EDCSR approach at different CRs. In other examples, the first neural network and the second neural network can use different EDCSR approaches. For example, one or both of the first neural network and the second neural network can be a LAPRAN network (as described in U.S. Patent Application Publication No. 2020/0234406 A1, the disclosure of which is incorporated herein by reference in its entirety). As another example, one or both of the first neural network and the second neural network can be a ReconNet (as described in Kuldeep Kulkarni, Suhas Lohit, Pavan Turaga, Ronan Kerviche, and Amit Ashok, "ReconNet: Non-Iterative Reconstruction of Images From Compressively Sensed Measurements," in *Proceedings of the IEEE Conference on Computer Vision and Pattern Recognition*, 2016, pp. 449-458).

As described further below with respect to FIGS. 2A-2C, in some embodiments one or more additional reconstructions may be performed as well using a third neural network, depending on application.

III. CRA Embodiments

Figure 2A:
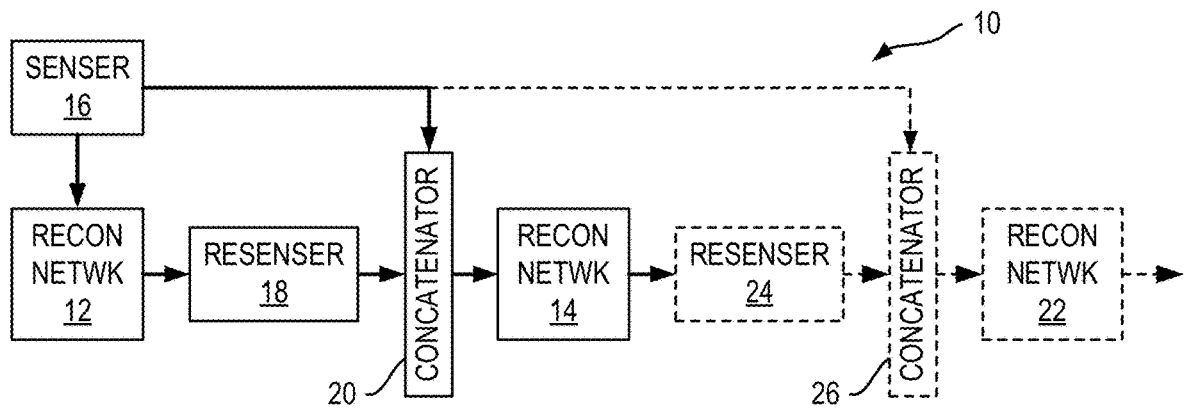
FIG. 2A is a schematic block diagram of the CRA according to a first embodiment.

FIG. 2A is a schematic block diagram of a CRA 10 according to a first embodiment. The CRA 10 includes a first reconstruction network 12 and a second reconstruction network 14. The first reconstruction network 12 generates a first reconstruction of an original signal based on a portion of first compressive measurements of the original signal. In some embodiments, the portion of the first compressive measurements is based on an input size of the first reconstruction network. The second reconstruction network 14 generates a second reconstruction of the original signal based on the first compressive measurements (e.g., all measurements from a compressive sensor 16) and second compressive measurements of the first reconstruction. The size of the second compressive measurements can be based on an input size of the second reconstruction network 14 (i.e., the difference between the input size of the second reconstruction network 14 and the first compressive measurements received from the compressive sensor 16).

The CRA 10 receives the first compressive measurements having a variable CR. The CRA 10 accordingly can include or receive compressive measurements from the compressive sensor 16. The compressive sensor 16 can adaptively perform CS of the original signal (e.g., an original image or other data) at various CRs in accordance with performance requirements and available resources. The CRA 10 further includes a compressive resensor 18, which performs CS of the first reconstruction of the original signal (produced by the first reconstruction network 12) to produce the second compressive measurements. In some embodiments, the compressive resensor 18 adaptively performs CS to adjust a size of the second compressive measurements in accordance with the input size of the second reconstruction network.

The CRA 10 further includes a concatenator 20 which concatenates the first compressive measurements with the second compressive measurements. In some embodiments, the concatenator 20 selects a portion of the second compressive measurements for concatenation according to the input size of the second reconstruction network 14 (e.g., where the compressive resensor 18 has a fixed CR, a size of the portion may be adjusted such that the concatenated result fits the input size).

In some embodiments, the CRA 10 includes a third (or more) reconstruction network 22. For example, the third reconstruction network 22 may generate a third reconstruction of the original signal based on the first compressive measurements and third compressive measurements of the second reconstruction. A second compressive resensor 24 produces the third compressive measurements of the second reconstruction, and a second concatenator 26 concatenates the first and third compressive measurements.

Figure 2B:
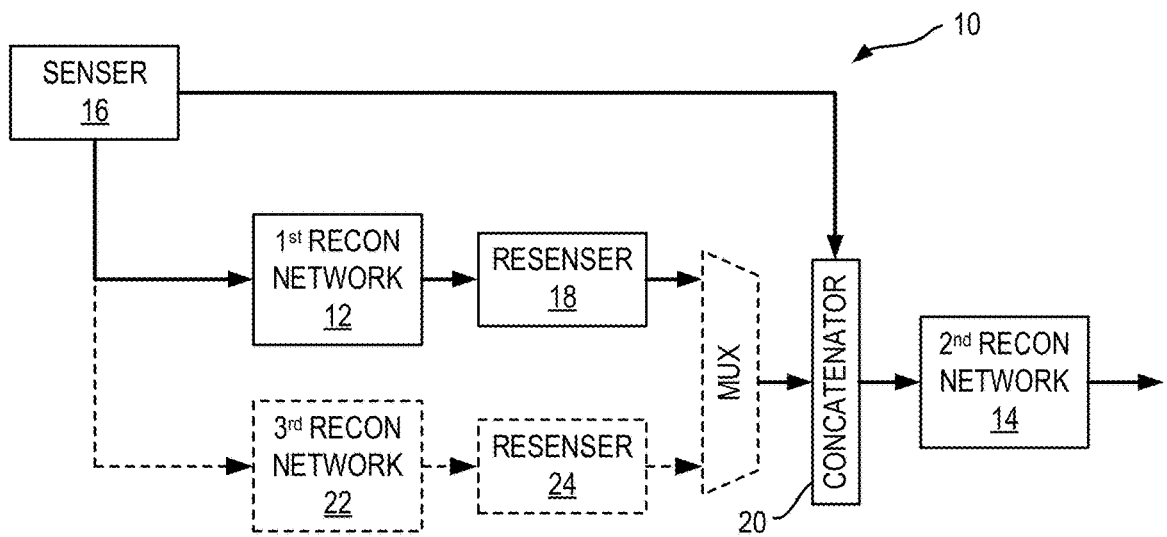
FIG. 2B is a schematic block diagram of the CRA according to a second embodiment.

FIG. 2B is a schematic block diagram of the CRA 10 according to a second embodiment. In this embodiment, the third reconstruction network 22 is placed in parallel with the first reconstruction network 12. The third reconstruction network 22 generates a third reconstruction of the original signal based on the same or another portion of the first compressive measurements of the original signal used in the first reconstruction network 12. In some examples, the third reconstruction network 22 has a different CR from the first reconstruction network 12. In some examples, the third reconstruction network 22 uses a different EDCSR approach from the first reconstruction network 12. The CRA 10 can select between the first reconstruction network 12 and the third reconstruction network 22 based on performance requirements and/or available resources.

Figure 2C:
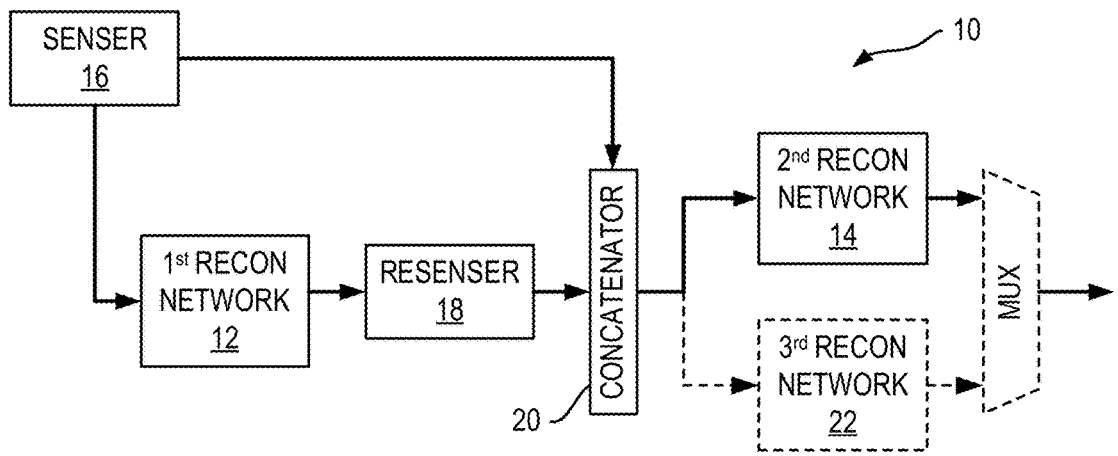
FIG. 2C is a schematic block diagram of the CRA according to a third embodiment.

FIG. 2C is a schematic block diagram of the CRA 10 according to a third embodiment. In this embodiment, the third reconstruction network 22 is placed in parallel with the second reconstruction network 14. The third reconstruction network 22 generates a third reconstruction of the original signal based on the first compressive measurements and the second compressive measurements of the first reconstruction. As with the embodiment of FIG. 2B, the third reconstruction network 22 can have a different CR and/or use a different EDCSR approach from the first reconstruction network 12. The CRA 10 can select between the first reconstruction network 12 and the third reconstruction network 22 based on performance requirements and/or available resources.

IV. Evaluation

The common setups of all the evaluations of CRA 10 are described below. The $CR_{max}$ and $CR_{min}$ are set to 30 and 5, respectively. Two sets of evaluations are conducted on different datasets. The first set of evaluations uses CIFAR10 (as described in Alex Krizhevsky and Geoffrey Hinton, "Learning Multiple Layers of Features From Tiny Images," Tech. Rep., Citeseer, 2009, resized to 64 by 64 for these evaluations) for both training and testing. The second set of evaluations uses a dataset described in the LAPRAN disclosure for training, and Set5 (as described in Marco Bevi- Iacqua, Aline Roumy, Christine Guillemot, and Marie Line Alberi-Morel, "Low-Complexity Single-Image Super-Resolution Based On Nonnegative Neighbor Embedding," in *British Machine Vision Conference (BMVC)*, 2012, pp. 135.1-135.10, cut into 64 by 64 blocks for these evaluations) for testing.

For each sample, CS with the same sensing matrix is performed for each RGB channel (the 2-D tensor of each channel is row-wise vectorized to a 4096-dimensional vector before sensing). The reconstruction is performed using the measurements of all three channels. The neural network library used is PyTorch (as described in Adam Paszke, Sam Gross, Soumith Chintala, Gregory Chanan, Edward Yang, Zachary DeVito, Zeming Lin, Alban Desmaison, Luca Antiga, and Adam Lerer, "Automatic Differentiation in PyTorch," in *NIPS-W*, 2017). The EDCSR frameworks used in the evaluations are ReconNet and LAPRAN.

For simplicity of illustration, the evaluation results are plotted with respect to measurement rate (MR), which is defined as $$MR = \frac{1}{CR}.$$

For each training dataset, 5% of the training samples are randomly selected as the validation set to avoid over-fitting. The model is tested on the validation set at the end of each training iteration. The model offering the best performance on the validation set is used for the final testing.

A. Comparison with Existing Solutions

Figure 3A:
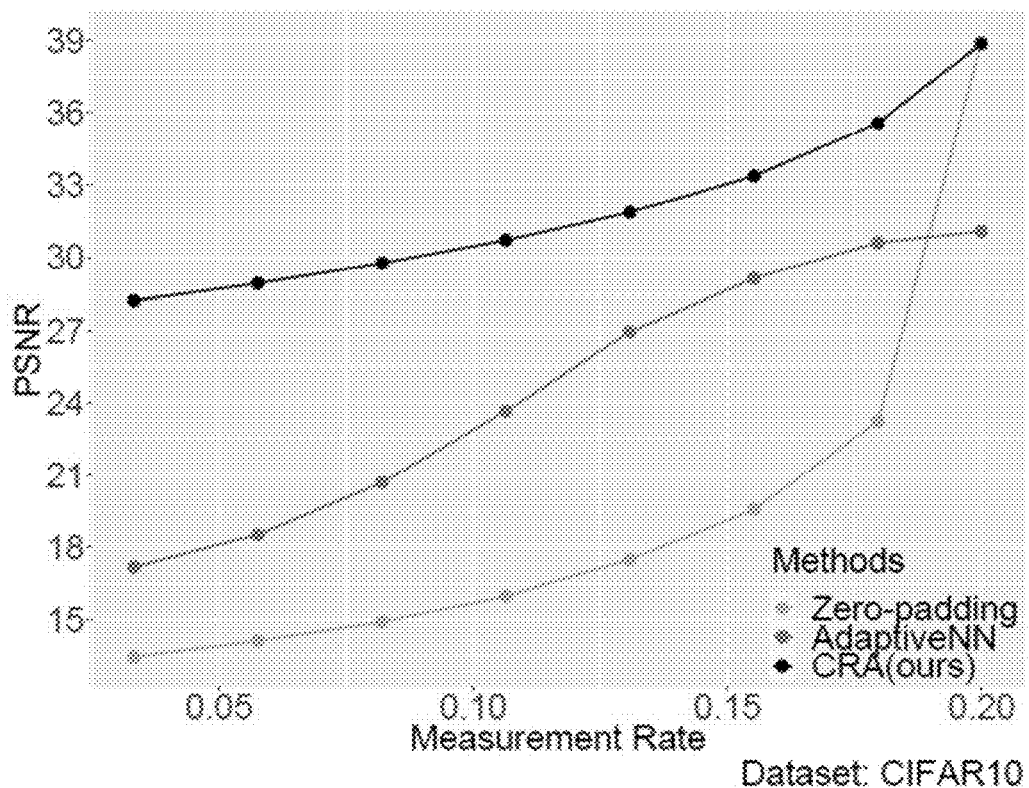
FIG. 3A is a graphical representation of evaluation results illustrating improved reconstruction accuracy of the CRA on a CIFAR10 dataset.
Figure 3B:
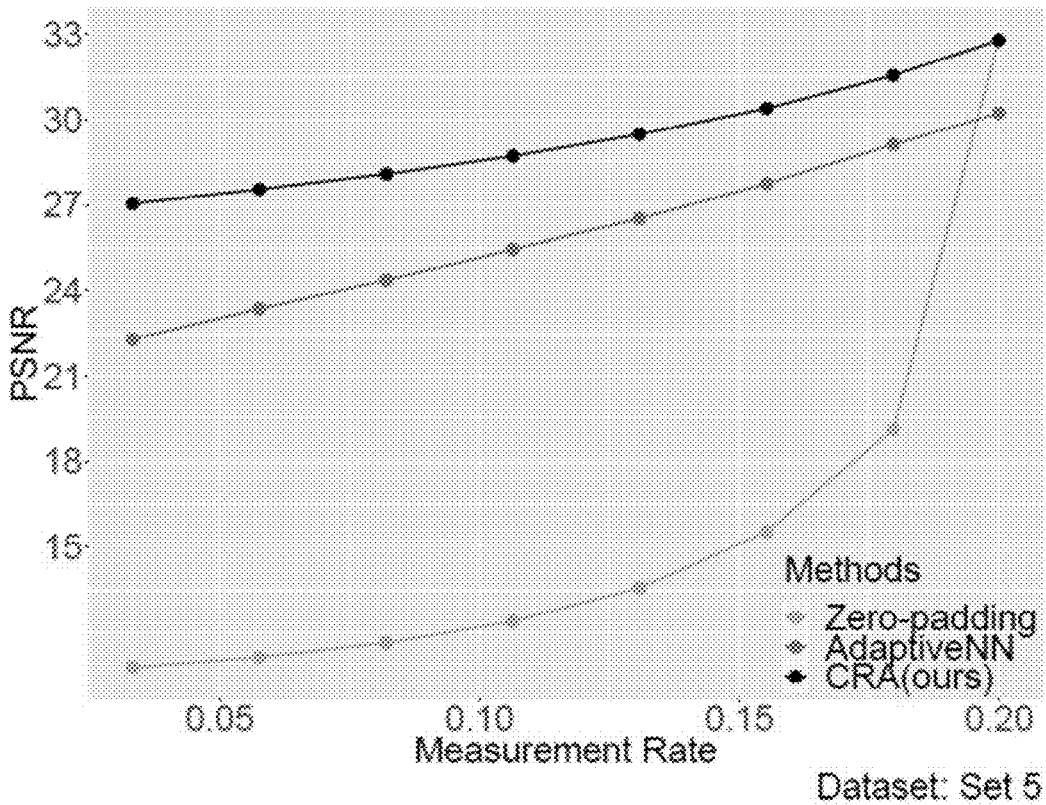
FIG. 3B is a graphical representation of evaluation results illustrating improved reconstruction accuracy of the CRA on a Set5 dataset.

FIG. 3A is a graphical representation of evaluation results illustrating improved reconstruction accuracy of the CRA on the CIFAR10 dataset. FIG. 3B is a graphical representation of evaluation results illustrating improved reconstruction accuracy of the CRA on the Set5 dataset. To demonstrate the effectiveness of the CRA, the reconstruction accuracy is compared against a modified version of AdaptiveNN and a naive zero-padding approach.

As the source codes of AdaptiveNN are unavailable, the AdaptiveNN model is re-implemented based on its original paper using PyTorch. It is found that the performance of AdaptiveNN is unexpectedly low and can be improved with some simple modifications. Specifically, a batch normalization layer is added right behind each convolution layer and the activation function is switched from a rectified linear unit (ReLU) to Tanh.

Evaluations on the CIFAR10 dataset (illustrated in FIG. 3A) show that the modified AdaptiveNN achieves more than 10000% and 10% improvement on the training speed and reconstruction accuracy, respectively, over the original AdaptiveNN. Zero-padding is a naive approach. Given the EDCSR framework that is trained at the lowest CR, the measurements that are sensed at a higher CR are simply complemented by zeros. The evaluation results on the CIFAR10 dataset (FIG. 3A) and the Set5 dataset (FIG. 3B) show that the CRA can achieve a 2.56-11.05 dB and 0-16.45 dB PSNR improvement over the AdaptiveNN and zero-padding approach, respectively, across the MRs of 0.33-0.2 (CRs of 30-5).

In theory, the accuracy-optimal approach for EDCSR frameworks to handle variable CR at run time is to train multiple reconstruction networks at each CR needed separately. This brute-force approach is referred to as MultiNN. In practice, the MultiNN approach is often impractical or unaffordable due to the enormous training time and computational resources required. Table 1 compares the total training time of MultiNN, AdaptiveNN, and the CRA needed for handling a variable CR (from 5 to 30) at a fine granularity (step size of m is 1). The number of epochs of MultiNN is estimated as $$\frac{(m_{max} - m_{min})}{\text{step size of } m} \times 300,$$

where $$m_{max} = \frac{n}{CR_{min}} = \frac{4096}{5} = 819, m_{min} = \frac{n}{CR_{max}} = \frac{4096}{30} = 136$$

and 300 is the predefined number of training iterations of a single ReconNet. The per epoch training time of ReconNet is estimated by averaging the per epoch training time of ReconNets trained at CRs of 5 and 30. The evaluation results show that the training time of the CRA is 99.5% and 97% less than MultiNN and AdaptiveNN, respectively. Specifically, MultiNN takes more than 52 days to train in this case.

TABLE 1

Training time comparison on CIFAR10

| Approach | MultiNN | AdaptiveNN | Compression Ratio Adapter |
|---|---|---|---|
| per epoch (second) | 22 | 73 | 22 |
| number of epochs | 204900 | 7430 | 600 |
| in total (hour) | 1252 | 150 | 4 |

B. Combining MultiNN and CRA

Figure 4:
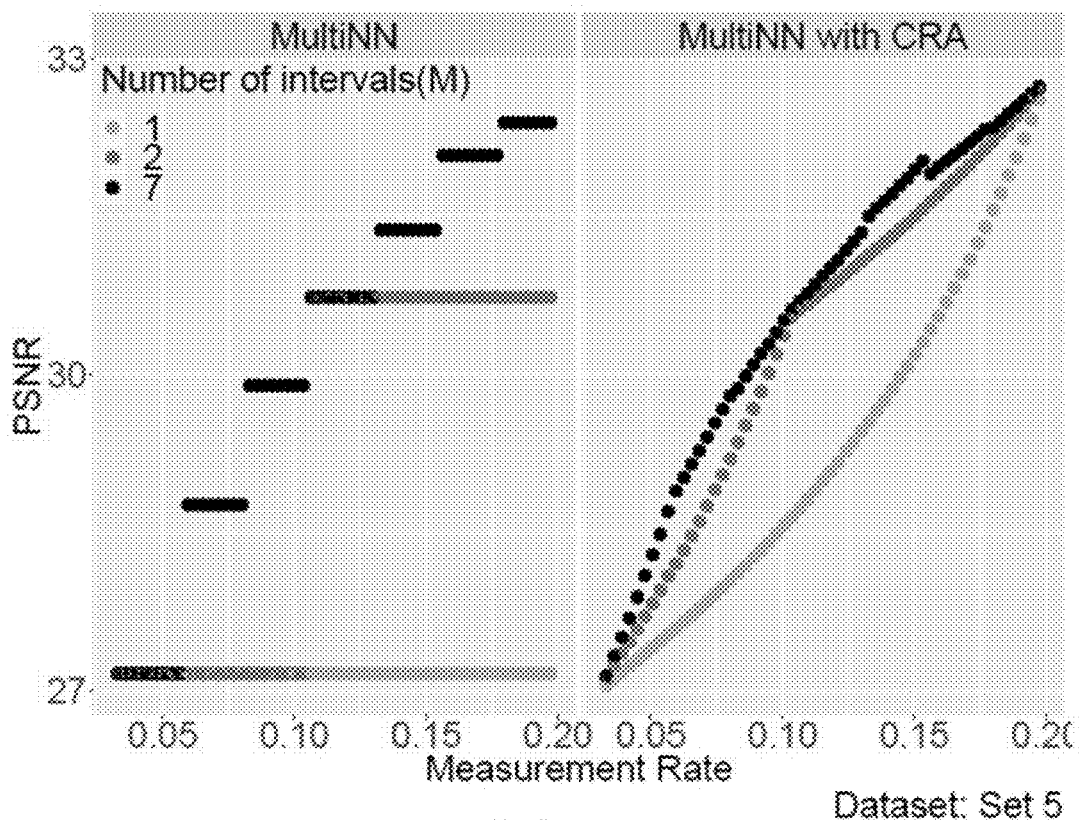
FIG. 4 is a graphical representation of evaluation results illustrating improved reconstruction accuracy of the CRA applied to MultiNN with standard MultiNN.

FIG. 4 is a graphical representation of evaluation results illustrating improved reconstruction accuracy of the CRA applied to MultiNN with standard MultiNN. Interestingly, one can combine the MultiNN approach with the CRA to further improve the reconstruction accuracy with reasonable additional training time. The key is to divide the MR values between the lowest and highest MR into M non-overlapping intervals. For each interval i, a corresponding initial reconstruction network $\beta_{init}^i$ and a main reconstruction network $f_{main}^i$ are trained at the lowest MR and the highest MR of the interval, respectively.

For an arbitrary MR (equivalently CR), one should find the interval j that the MR belongs to and use the corresponding $f_{init}^j$ and $f_{main}^j$ to reconstruct the signal. Additionally, as the highest MR of each interval i is equal to the lowest MR of next interval i+1, each $f_{main}^i$ can be used as $f_{init}^{i+1}$. Consequently, the total number of EDCSR frameworks to be trained is M+1. Total training time is proportional to the number of frameworks to be trained.

To illustrate the impact of combining the CRA with MultiNN, the accuracy-MR trade-off curve is compared between MultiNN only and MultiNN combined with the CRA for the cases of 1, 2, and 7 intervals. It is shown that the MultiNN approach with a small number of intervals (reasonable training time) can only provide a piece-wise constant approximation of the theoretically optimal accuracy-MR trade-off curve. Differently, MultiNN combined with the CRA is able to provide a piece-wise linear approximation of the theoretically optimal accuracy-MR trade-off curve for EDCSR frameworks to handle variable CR at run time.

C. Combining Two Different EDCSR Frameworks

Figure 5:
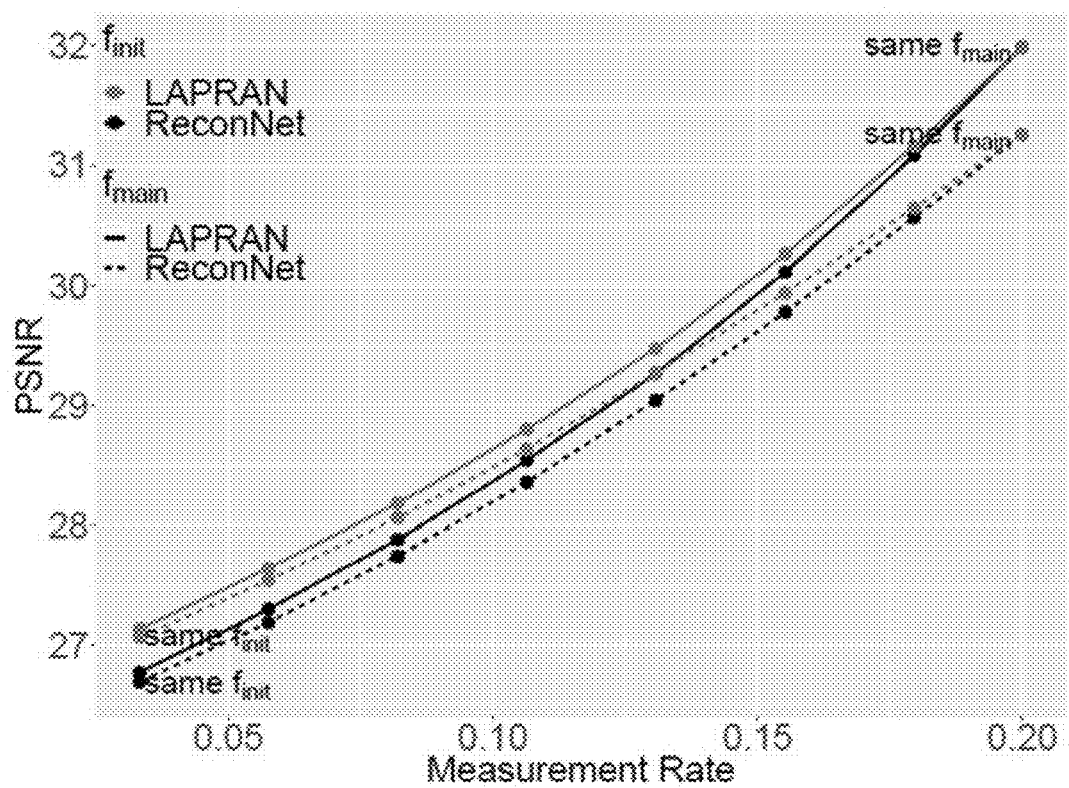
FIG. 5 is a graphical representation of evaluation results illustrating improved reconstruction accuracy of the CRA applied to combining two end-to-end data-driven compressive sensing (CS) reconstruction (EDCSR) frameworks.

FIG. 5 is a graphical representation of evaluation results illustrating improved reconstruction accuracy of the CRA applied to combining two EDCSR frameworks. Since the CRA is generic, one can also adopt two different EDCSR models as the $f_{init}$ and $f_{main}$, respectively. FIG. 5 shows the reconstruction performance of combining ReconNet and LAPRAN by applying the CRA in all possible combinations. It is shown that for low and high MRs, the reconstruction accuracy is more determined by choice of the EDCSR model as the initial and the main reconstruction network, respectively.

V. Computer System

Figure 6:
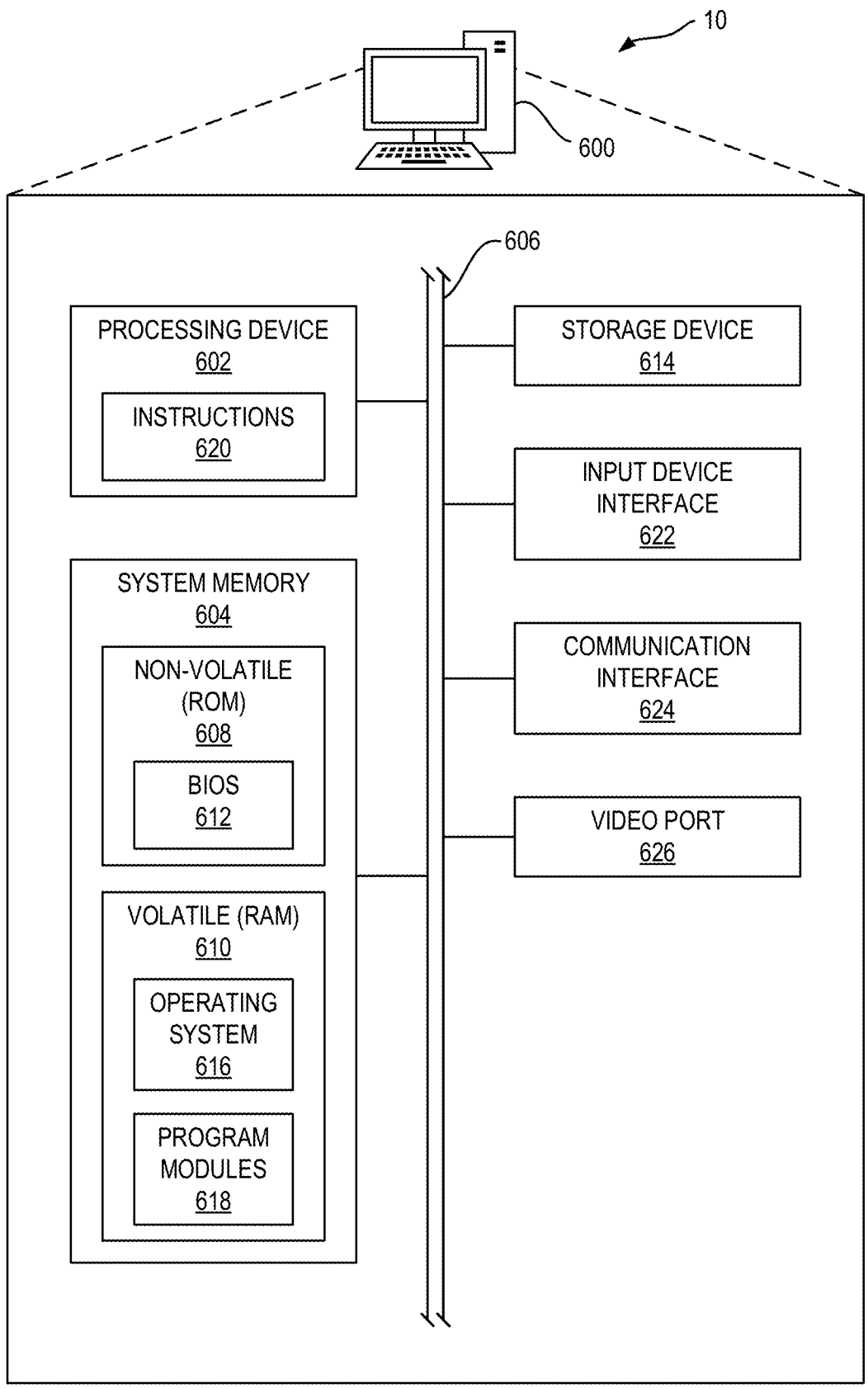
FIG. 6 is a block diagram of a CRA (which may be implemented in an image processing system or signal processing system) according to embodiments disclosed herein.

FIG. 6 is a block diagram of a CRA 10 (which may be implemented in an image processing system or signal processing system) according to embodiments disclosed herein. The CRA 10 includes or is implemented in a computer system 600, which comprises any computing or electronic device capable of including firmware, hardware, and/or executing software instructions that could be used to perform any of the methods or functions described above, such as adapting a compressive sensing framework for an adaptive CR. In this regard, the computer system 600 may be a circuit or circuits included in an electronic board card, such as a printed circuit board (PCB), a server, a personal computer, a desktop computer, a laptop computer, an array of computers, a personal digital assistant (PDA), a computing pad, a mobile device, or any other device, and may represent, for example, a server or a user's computer.

The exemplary computer system 600 in this embodiment includes a processing device 602 or processor, a system memory 604, and a system bus 606. The system memory 604 may include non-volatile memory 608 and volatile memory 610. The non-volatile memory 608 may include read-only memory (ROM), erasable programmable read-only memory (EPROM), electrically erasable programmable read-only memory (EEPROM), and the like. The volatile memory 610 generally includes random-access memory (RAM) (e.g., dynamic random-access memory (DRAM), such as synchronous DRAM (SDRAM)). A basic input/output system (BIOS) 612 may be stored in the non-volatile memory 608 and can include the basic routines that help to transfer information between elements within the computer system 600.

The system bus 606 provides an interface for system components including, but not limited to, the system memory 604 and the processing device 602. The system bus 606 may be any of several types of bus structures that may further interconnect to a memory bus (with or without a memory controller), a peripheral bus, and/or a local bus using any of a variety of commercially available bus architectures.

The processing device 602 represents one or more commercially available or proprietary general-purpose processing devices, such as a microprocessor, central processing unit (CPU), or the like. More particularly, the processing device 602 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processing device 602 is configured to execute processing logic instructions for performing the operations and steps discussed herein.

In this regard, the various illustrative logical blocks, modules, and circuits described in connection with the embodiments disclosed herein may be implemented or performed with the processing device 602, which may be a microprocessor, field programmable gate array (FPGA), a digital signal processor (DSP), an application-specific integrated circuit (ASIC), or other programmable logic device, a discrete gate or transistor logic, discrete hardware components, or any combination thereof designed to perform the functions described herein. Furthermore, the processing device 602 may be a microprocessor, or may be any conventional processor, controller, microcontroller, or state machine. The processing device 602 may also be implemented as a combination of computing devices (e.g., a combination of a DSP and a microprocessor, a plurality of microprocessors, one or more microprocessors in conjunction with a DSP core, or any other such configuration).

The computer system 600 may further include or be coupled to a non-transitory computer-readable storage medium, such as a storage device 614, which may represent an internal or external hard disk drive (HDD), flash memory, or the like. The storage device 614 and other drives associated with computer-readable media and computer-usable media may provide non-volatile storage of data, data structures, computer-executable instructions, and the like. Although the description of computer-readable media above refers to an HDD, it should be appreciated that other types of media that are readable by a computer, such as optical disks, magnetic cassettes, flash memory cards, cartridges, and the like, may also be used in the operating environment, and, further, that any such media may contain computer-executable instructions for performing novel methods of the disclosed embodiments.

An operating system 616 and any number of program modules 618 or other applications can be stored in the volatile memory 610, wherein the program modules 618 represent a wide array of computer-executable instructions corresponding to programs, applications, functions, and the like that may implement the functionality described herein in whole or in part, such as through instructions 620 on the processing device 602. The program modules 618 may also reside on the storage mechanism provided by the storage device 614. As such, all or a portion of the functionality described herein may be implemented as a computer program product stored on a transitory or non-transitory computer-usable or computer-readable storage medium, such as the storage device 614, non-volatile memory 608, volatile memory 610, instructions 620, and the like. The computer program product includes complex programming instructions, such as complex computer-readable program code, to cause the processing device 602 to carry out the steps necessary to implement the functions described herein.

An operator, such as the user, may also be able to enter one or more configuration commands to the computer system 600 through a keyboard, a pointing device such as a mouse, or a touch-sensitive surface, such as the display device, via an input device interface 622 or remotely through a web interface, terminal program, or the like via a communication interface 624. The communication interface 624 may be wired or wireless and facilitate communications with any number of devices via a communications network in a direct or indirect fashion. An output device, such as a display device, can be coupled to the system bus 606 and driven by a video port 626. Additional inputs and outputs to the computer system 600 may be provided through the system bus 606 as appropriate to implement embodiments described herein.

The operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined.

Those skilled in the art will recognize improvements and modifications to the preferred embodiments of the present disclosure. All such improvements and modifications are considered within the scope of the concepts disclosed herein and the claims that follow.

What is claimed is:

1. A method for adapting a compressive sensing framework for a variable compression ratio, the method comprising:
generating a first reconstruction of an original signal based on a portion of first compressive measurements of the original signal; and
generating a second reconstruction of the original signal based on the first compressive measurements and second compressive measurements of the first reconstruction.

2. The method of claim 1, wherein generating the second reconstruction of the original signal comprises generating the second reconstruction at a fixed resolution from the first compressive measurements having a variable compression ratio.

3. The method of claim 1, further comprising generating the first compressive measurements by compressively sensing the original signal.

4. The method of claim 1, further comprising generating the second compressive measurements by compressively sensing the first reconstruction.

5. The method of claim 4, further comprising concatenating the first compressive measurements with the second compressive measurements;
wherein generating the second reconstruction comprises inputting the concatenated first compressive measurements and second compressive measurements into a machine learning algorithm.

6. The method of claim 1, wherein the first reconstruction is generated using machine learning.

7. The method of claim 6, wherein:
the first reconstruction of the original signal is generated with a first neural network; and
the second reconstruction of the original signal is generated with a second neural network.

8. The method of claim 1, wherein the second reconstruction comprises a final reconstruction of the original signal.

9. The method of claim 1, further comprising generating a third reconstruction of the original signal based on the first compressive measurements and third compressive measurements of the second reconstruction.

10. The method of claim 9, wherein the third reconstruction comprises a final reconstruction of the original signal.

11. A compression ratio adapter, comprising:
a first reconstruction network configured to generate a first reconstruction of an original signal based on a portion of first compressive measurements of the original signal; and
a second reconstruction network configured to generate a second reconstruction of the original signal based on the first compressive measurements and second compressive measurements of the first reconstruction.

12. The compression ratio adapter of claim 11, wherein the compression ratio adapter is configured to receive the first compressive measurements having a variable compression ratio.

13. The compression ratio adapter of claim 11, further comprising a compressive sensor configured to produce the first compressive measurements of the original signal.

14. The compression ratio adapter of claim 11, further comprising a compressive resensor configured to produce the second compressive measurements of the first reconstruction in accordance with an input size of the second reconstruction network.

15. The compression ratio adapter of claim 14, further comprising a concatenator configured to concatenate the first compressive measurements with the second compressive measurements.

16. The compression ratio adapter of claim 11, further comprising a third reconstruction network configured to generate a third reconstruction of the original signal based on the first compressive measurements and third compressive measurements of the second reconstruction.

17. The compression ratio adapter of claim 16, further comprising a first compressive resensor configured to produce the second compressive measurements of the first reconstruction in accordance with an input size of the second reconstruction network.

18. The compression ratio adapter of claim 17, further comprising a second compressive resensor configured to produce the third compressive measurements of the second reconstruction.

19. The compression ratio adapter of claim 11, further comprising a third reconstruction network in parallel with the first reconstruction network and configured to generate a third reconstruction of the original signal based on the portion or another portion of the first compressive measurements of the original signal.

20. The compression ratio adapter of claim 11, further comprising a third reconstruction network in parallel with the second reconstruction network and configured to generate a third reconstruction of the original signal based on the first compressive measurements and the second compressive measurements of the first reconstruction.

* * * * *